(12) United States Patent
Bulsoni et al.

(10) Patent No.: US 10,275,429 B2
(45) Date of Patent: Apr. 30, 2019

(54) KERNEL BASED STRING DESCRIPTORS

(71) Applicant: International Business Machines Corporation, Armonk, NY (US)

(72) Inventors: Felipe G. Bulsoni, Sao Paulo (BR); Alex T. S. Carneiro, Sao Paulo (BR); Rafael T. Davoli, Sao Jose de Campos (BR); Phillip L. Viana, Sao Paulo (BR)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 853 days.

(21) Appl. No.: 14/849,624

(22) Filed: Sep. 10, 2015

(65) Prior Publication Data
US 2016/0070679 A1      Mar. 10, 2016

(30) Foreign Application Priority Data

Sep. 10, 2014   (CA) .................................. 2862955

(51) Int. Cl.
| | | |
|---|---|---|
| *G06F 17/27* | (2006.01) | |
| *G06F 17/22* | (2006.01) | |
| *H03M 7/30* | (2006.01) | |
| *G06K 9/72* | (2006.01) | |
| *G06F 17/21* | (2006.01) | |

(52) U.S. Cl.
CPC ........... *G06F 17/2217* (2013.01); *G06K 9/72* (2013.01); *H03M 7/3088* (2013.01)

(58) Field of Classification Search
CPC ..... G06F 17/2217; G06K 9/72; H03M 7/3088
USPC .................................................. 704/8, 9, 257
See application file for complete search history.

(56) References Cited

U.S. PATENT DOCUMENTS

| | | |
|---|---|---|
| 6,618,697 B1 | 9/2003 | Kantrowitz et al. |
| 2012/0117101 A1 | 5/2012 | Unruh |

OTHER PUBLICATIONS

Wikipedia, "Euler's formula", http://en.wikipedia.org/wiki/Euler's_formula, 2015, 9 pages.

(Continued)

*Primary Examiner* — Thierry L Pham
(74) *Attorney, Agent, or Firm* — Cantor Colburn LLP; Richard Wilhelm

(57) ABSTRACT

An aspect of generating a descriptor representative of a text unit includes receiving as input a text string into a memory accessible to a processor and parsing the text string into words. For each word in the text string, a word is selected to form a selected word and, for each character in the selected word, a selected mapping is applied to a character of the selected word to create a mapped value, the mapped value is normalized to create a normalized value, and a numeric descriptor is generated using the normalized value. The numeric descriptors are collected for the selected word to create a word descriptor and the collected numeric descriptors are saved in a storage device by the processor.

17 Claims, 9 Drawing Sheets

(56) References Cited

OTHER PUBLICATIONS

Wikipedia, "Hamming distance", www.princeton.edu/~achaney/tmve/wiki100k/docs/Hamming_distance.html, 2015, 4 pages.
Wikipedia, "Jaro-Winkler distance", http://en.wikipedia.org/wiki/Jaro—Winkler_distance, 2015, 5 pages.
Wikipedia, "Levenshtein distance", http://en.wikipedia.org/wiki/Levenshtein_distance, 2015, 7 pages.
Cesar Souza, "Kernel Functions for Machine Learning Applications", Mar. 2010, 23 pages, http://crsouza.blogspot.com/2010/03/kernel-functions-for-machine-learning.html.
Guazzelli et al., "PMML: An Open Standard for Shaing Models" Contributed Research Articles, vol. 1, May 2009, pp. 60-65.

FIG. 5

500

502 — D1 = $c_1 \cdot k(0) + c_2 \cdot k(1) + c_3 \cdot k(2)$

504 — D2 = $c_1 \cdot k(-1) + c_2 \cdot k(0) + c_3 \cdot k(1)$

506 — D3 = $c_1 \cdot k(-2) + c_2 \cdot k(-1) + c_3 \cdot k(0)$

508 — D4 = $c_1 \cdot k(-3) + c_2 \cdot k(-2) + c_3 \cdot k(-1)$

510 — "word" = $c_1 + c_2 + c_3$

FIG. 6

| STRING 614 | DESCRIPTOR 1  616 | DESCRIPTOR 2  618 | DESCRIPTOR 3  620 | DESCRIPTOR 4  622 |
|---|---|---|---|---|
| they  602 | 0.8457450  606 | 1.1873885  608 | 1.6540122 | 2.0417402 |
| them | 0.8371116 | 1.1301711 | 1.4140122 | 1.6189576 |
| their | 0.8359152 | 1.1233292 | 1.4150702 | 1.8180301 |
| that | 0.8230753 | 1.0835479 | 1.4130847 | 1.7084586 |
| the | 0.8284782 | 1.0729537 | 1.1740122 | 1.196175 |
| hat | 0.3372174 | 0.6549639 | 0.9487134 | 1.0262366 |
| hit  604 | 0.4972174  610 | 0.9368189  612 | 1.2629579 | 1.3454453 |
| bit | 0.2858261 | 0.7011356 | 1.0235513 | 1.1055258 |
| aim | 0.2172174 | 0.5218551 | 0.7370270 | 0.7905754 |
| buy | 0.5496667 | 1.2239182 | 1.6710773 | 1.7807417 |

Descriptor table
600

SCATTER PLOT 700

Figure 1:
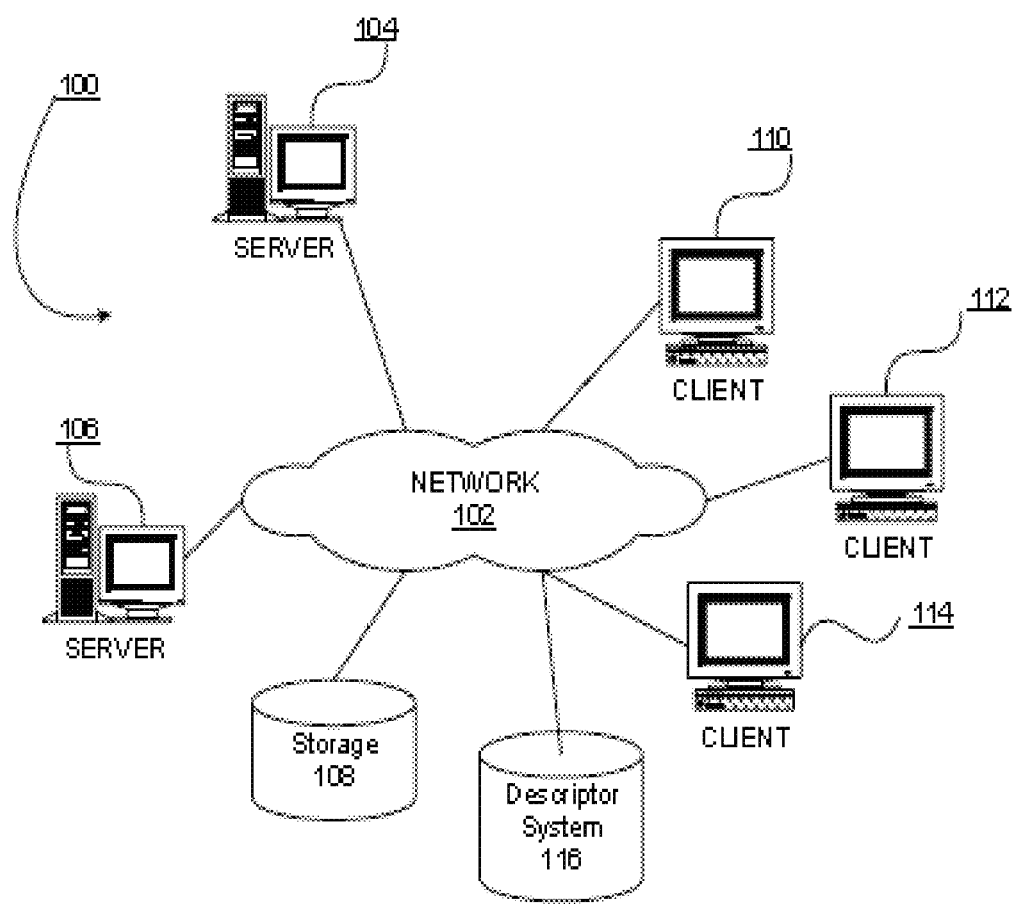

KERNEL BASED STRING DESCRIPTORS

FOREIGN PRIORITY

This application claims priority to Canadian Patent Application No. 2,862,955, filed 10 Sep. 2014, and all the benefits accruing therefrom under 35 U.S.C. § 119, the contents of which in its entirety are herein incorporated by reference.

BACKGROUND

This disclosure relates generally to data analysis in a data processing system and more specifically to data analytics of character strings using descriptors in the data processing system.

A typical problem is an apparent lack of tools or methods to reliably find patterns among words in a portion of text. The problem is compounded by a further requirement to accommodate a level of variability and keyboard typing error tolerance associated with the respective characters comprising the text string.

Currently there are diverse string comparison methods some of which use forceful methods during comparisons. A comparison typically comprises comparing character by character of each word in the words in a text string. The words are compared to verify whether characters match and not whether the characters are "close" to one another. One example string comparison calculates a "distance" between two strings of equal length as a number of positions at which the corresponding symbols of the stings being compared are different, as in a Hamming distance In another example a comparison is performed in which each character of a first string is compared with corresponding matching characters of a second string. In this example a number of matching characters, which have a different sequence order, are divided by 2 to further define a number of transpositions of the characters. This example may be referred to as a Bonacci distance, a variant of a Jaro-Winkler distance.

In another example, a Levenshtein distance, is a measure of a difference between two string sequences calculated as a minimum number of single-character edits, comprising insertions, deletions or substitutions, required to change a first word into a second word.

In current solutions, there are limitations associated with typing error tolerance and a lack of support for a desired amount of variability in matching.

SUMMARY

According to an embodiment, a method for generating a descriptor representative of a text unit comprises receiving as input a text string into a memory accessible to a processor and parsing, by the processor, the text string into words. For each word in the text string, the processor selects a word to form a selected word and, for each character in the selected word, applies a selected mapping to a character of the selected word to create a mapped value, normalizes the mapped value to create a normalized value from which is generated a numeric descriptor. The processor collects the numeric descriptors for the selected word to create a word descriptor and the numeric descriptors collected are saved by the processor in a storage device.

BRIEF DESCRIPTION OF THE DRAWINGS

For a more complete understanding of this disclosure, reference is now made to the following brief description, taken in conjunction with the accompanying drawings and detailed description, wherein like reference numerals represent like parts.

FIG. 1 is a block diagram of an exemplary network data processing system operable for various embodiments of the disclosure;

FIG. 2 is a block diagram of an exemplary data processing system operable for various embodiments of the disclosure;

FIG. 3 is a block diagram of a descriptor system operable for various embodiments of the disclosure operable for various embodiments of the disclosure;

FIG. 4 is a flow chart of a simplified mapping process operable for various embodiments of the disclosure;

FIG. 5 is a textual representation of a descriptor generation operable for various embodiments of the disclosure;

FIG. 6 is a tabular representation of a set of generated descriptors operable for various embodiments of the disclosure;

FIG. 7 a chart representation of a set of generated descriptors operable for various embodiments of the disclosure;

FIG. 8 is a graphic representation of a keyboard layout map operable for various embodiments of the disclosure; and FIG. 9 is a flowchart of a process of generating descriptors operable for various embodiments of the disclosure.

DETAILED DESCRIPTION

With reference now to the Figures and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 depicts a pictorial representation of a network of data processing systems in which illustrative embodiments may be implemented. Network data processing system 100 is a network of computers in which the illustrative embodiments may be implemented. Network data processing system 100 contains a network 102, as the medium used to provide communications links between various devices and computers connected together within network data processing system 100. Network 102 may include connections, such as wire, wireless communication links, or fiber optic cables.

In the depicted example, a server 104 and a server 106 connect to network 102 along with a storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

Figure 2:
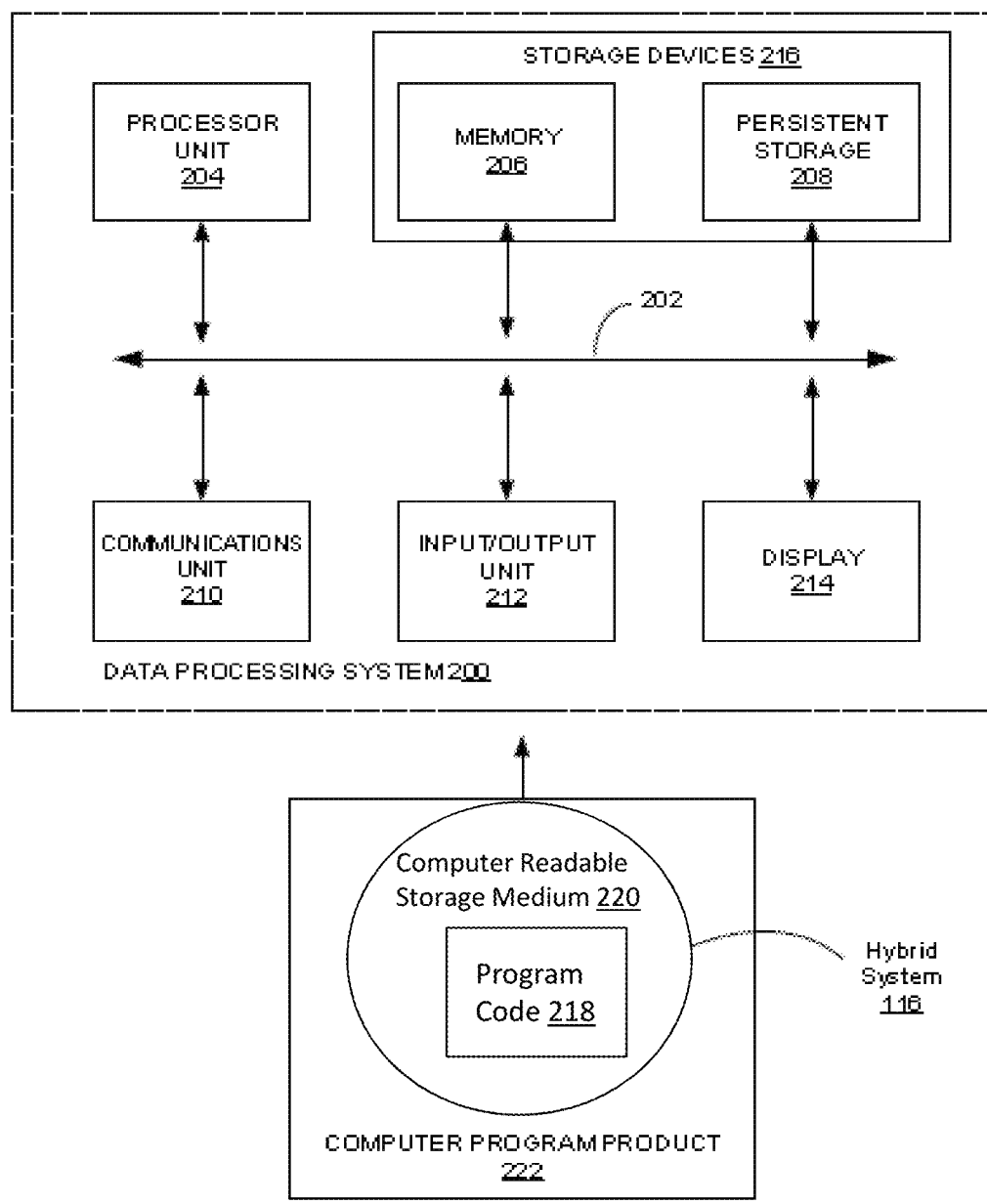

With reference to FIG. 2 a block diagram of an exemplary data processing system operable for various embodiments is presented. In this illustrative example, data processing system 200 includes a communications fabric 202, which provides communications between a processor unit 204, a memory 206, a persistent storage 208, a communications unit 210, an input/output (I/O) unit 212, and a display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices 216. A storage device is any piece of hardware that is capable of storing information, such as, for example without limitation, data, program code in functional form, and/or other suitable information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to data processing system 200. For example, input/output unit 212 may provide a connection for user input through a keyboard, a mouse, and/or some other suitable input device. Further, input/output unit 212 may send output to a printer. Display 214 provides a mechanism to display information to a user.

Instructions for the operating system, applications and/or programs may be located in storage devices 216, which are in communication with processor unit 204 through communications fabric 202. In these illustrative examples the instructions are in a functional form on persistent storage 208. These instructions may be loaded into memory 206 for execution by processor unit 204. The processes of the different embodiments may be performed by processor unit 204 using computer-implemented instructions, which may be located in a memory, such as memory 206.

These instructions are referred to as program code, computer usable program code, or computer readable program code that may be read and executed by a processor in processor unit 204. The program code in the different embodiments may be embodied on different physical or tangible computer readable storage media, such as memory 206 or persistent storage 208.

As shown in FIG. 2, program code 218 is located in a functional form on a computer readable storage media 220 that is selectively removable and may be loaded onto or transferred to data processing system 200 for execution by processor unit 204. Program code 218 and computer readable storage media 220 form a computer program product 222 in these examples. In one example, computer readable storage media 220 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer readable storage media 220 also may take the form of a persistent storage, such as a hard drive, a thumb drive, or a flash memory that is connected to data processing system 200. The tangible form of computer readable storage media 220 is also referred to as computer recordable storage media or a computer readable data storage device. In some instances, computer readable storage media 220 may not be removable.

Alternatively, program code 218 may be transferred to data processing system 200 from computer readable storage media 220 through a communications link to communications unit 210 and/or through a connection to input/output unit 212. The communications link and/or the connection may be physical or wireless in the illustrative examples.

In some illustrative embodiments, program code 218 may be downloaded over a network to persistent storage 208 from another device or data processing system for use within data processing system 200. For instance, program code stored in a computer readable data storage device in a server data processing system may be downloaded over a network from the server to data processing system 200. The data processing system providing program code 218 may be a server computer, a client computer, or some other device capable of storing and transmitting program code 218.

Using data processing system 200 of FIG. 2 as an example, a computer-implemented process for generating a descriptor representative of a text unit, is presented. Processor unit 204 receives as input a text string into a memory accessible to the processor. Processor unit 204 parses the text string into words and selects a word from the words to form a selected word. Processor unit 204 applies a selected mapping to a character of the selected word to create a mapped value and further normalizes the mapped value to create a normalized value. Processor unit 204 generates a numeric descriptor using the normalized value and further collects the numeric descriptors for the selected word to create a word descriptor. Processor unit 204 saves the descriptors collected by the processor in a storage device selected from storage devices 216.

In one embodiment, a kernel transformation and a keyboard layout mapping is used to create a descriptor of a string. A descriptor associated with each different respective string is then used to identify a particular pattern within a respective analyzed string of text. Using an exemplary embodiment enables a calculation of an absolute positioning of a descriptor space associated with a particular string while the keyboard mapping enables calculation of a spatial distance between key pairs on a specified keyboard layout.

Comparing arrays of descriptors is typically easier than comparing the strings natively, because a set of a fixed number of elements in arrays is used to represent strings of different sizes. Accordingly an exemplary embodiment simplifies a task of identifying patterns in strings of varying sizes.

An embodiment further enables selection of a method to convert a character of a string into a numeric representation, for example, ASCII encoding, another predetermined character encoding, a selected predetermined keyboard mapping, or another selected predefined mapping. Using the numbers as a basis for a kernel-based transformation, transforming the string into a numeric descriptor and comparing the descriptors is used rather than character codes per se for a comparison as in prior solutions. For example, an embodiment is used in identifying a text pattern by comparing one or more string descriptors of a first word to one or more string descriptors of a second word in a text stream. The string descriptors created through use of an embodiment are thus compared rather than raw character values.

Figure 3:
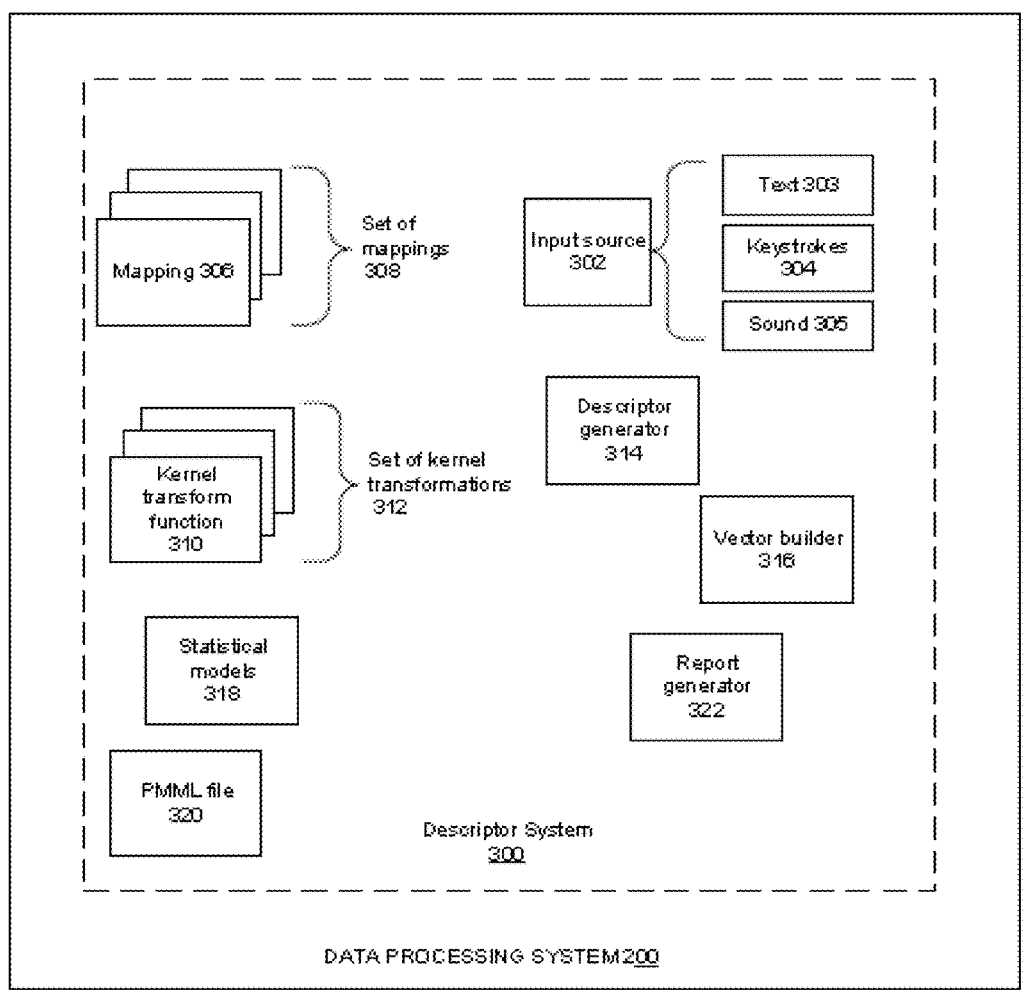

With reference to FIG. 3, a block diagram of a descriptor system operable for various embodiments is presented. Descriptor system 300 is a version of descriptor system 116 of FIG. 1 including representative components thereof. Embodiments of the disclosed descriptor system 300 may be implemented as a middle ware component of a data processing system, for example, data processing system 200 of FIG. 2.

Mapping provisions of descriptor system 300 include a set of mappings comprising one or more character maps. Mapping 306 comprises one or maps including types of mapping of keyboard layout mapping, character encoding maps, voice-based mapping, for example in which the letters 's' and 'z' have similar weights, because the letters have similar pronunciation sounds and optical character recognition (OCR), in which the mapping depends upon a similarity of letter shapes.

Mappings 306 are therefore directed toward content similarity. An embodiment of descriptor system 300 differs from previous solutions through use of kernel-based string descriptors for characters of a particular text segment (a specific word) in the form of a fixed-size numeric vector, and not the actual words. Accordingly, embodiments of descriptor system 300 are typically more suitable to use with a specific mapping, for example, including a particular keyboard mapping, selected images of scanned text or a selected phonetic mapping.

Descriptor system 300 further leverages data processing system 200 of FIG. 2 to provide system resources including a keyboard and a network adapter as input hardware devices, and a monitor as an output hardware device. Further included is a component that receives an input source 302 including text from a source, for example, text items from a web page, a blog, a social network feed, in the form of text 303, a user typing on keyboard in the form of keystrokes 304, or sound input in the form of sound 305.

One or more of kernel transform functions 310 comprise a set of kernel transformations 312 used to transform the text from input source 302 into numeric descriptors. A selected one of the one or more of kernel transform functions 310 is used with a mechanism, in the form of a descriptor generator 314 that transforms the text input received into numeric descriptors based on the mapping of each character of the respective text (using a selected mapping) and applies a specified kernel-based transformation.

Descriptor output from descriptor generator 314 is saved in a trained Predictive Model Markup Language (PMML) file 320. PMML is defined in an XML-based file format maintained by the Data Mining Group. The specification is designed to provide applications an ability to describe and exchange data models produced by data mining and machine learning algorithms. PMML file 320 is created by typical predefined statistical software using a training data set composed of previously analyzed words, generated using descriptor system 300 method. For further information regarding the PMML format.

Statistical models 318 represent a set of predefined statistical models used in discovering patterns in a vector. Vector builder 316 is a component providing a capability of aggregating the individual descriptors of the respective characters of a particular word in to a word vector.

Report generator 322 is a component that creates reports based on the results obtained from the descriptor builder, vector builder or comparison operation.

Figure 4:
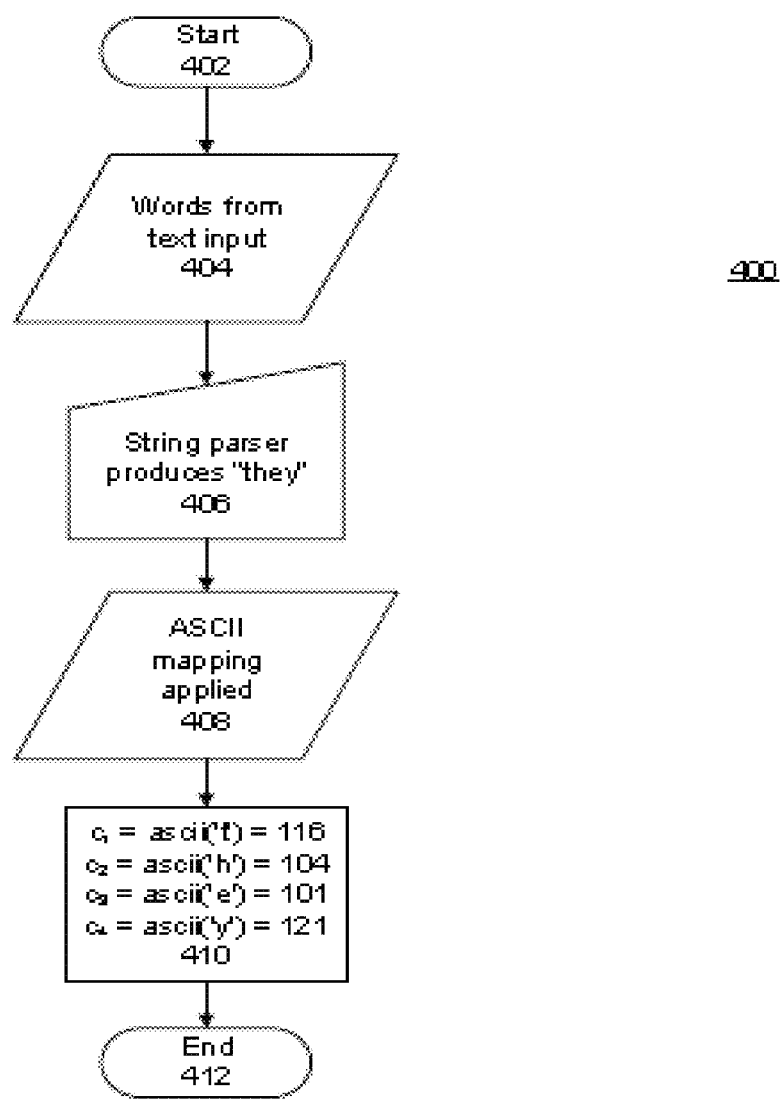

With reference to FIG. 4, a flow chart of a simplified mapping process operable for various embodiments is presented. Process 400 represents a series of operations of mapping a text input string into a corresponding set of numeric values in a high level view.

Process 400 begins (block 402) and receives words from a text input source (block 404). The isolation of each word in the text is performed (block 406). In this example, string parser produces "they" as an individual word. Each letter of the word "they" is mapped when ASCII mapping is applied (block 408). In another example of mapping, for example when a keyboard layout is used, an (x, y) pairing is created for each letter depending on a respective position on the keyboard layout. Continuing the example using the ASCII mapping results in a set of numeric values of 116, 104, 101 and 121 corresponding to characters $c_1$, $c_2$, $c_3$ and $c_4$ of the word "they" (block 410) and process 400 terminates thereafter (block 412).

With reference to FIG. 5, a textual representation of a descriptor generation operable for various embodiments is presented. Descriptors 500 represent a set of descriptors associated to three letters of a particular word in accordance with descriptor system 300 of FIG. 3.

The result of each mapping, for example a mapping as shown in FIG. 4, is processed through a kernel-based transformation. As a result of the transformation a vector of descriptors is produced. In the current example, a word 510 comprising a word of three letters $c_1+c_2+c_3$ is the source for the kernel transformation which yields a set of descriptors 502-508.

Descriptor 502 represents a first numeric descriptor for the word, while descriptor 504, 506 and 508 represents a second, third and fourth numeric descriptor for the word. The number of letters in a particular word and a number of descriptors selected to represent the word have no relationship. For example, a word with ten letters can be represented by only a first and second descriptor, or a word with only three letters can be represented by ten different descriptors. The number of descriptors accordingly depends upon a choice of the user.

Each of the calculated descriptors may be derived using a particular phi function as in:

First descriptor → k(x − 1)   Second descriptor → k(x − 2)   Third descriptor → k(x − 3)   Fourth descriptor → k(x − 4)

$$\phi_1 = \sum_{n=1}^{3} \overline{c}_n \times k(n-1) \qquad \phi_2 = \sum_{n=1}^{3} \overline{c}_n \times k(n-2) \qquad \phi_3 = \sum_{n=1}^{3} \overline{c}_n \times k(n-3) \qquad \phi_4 = \sum_{n=1}^{3} \overline{c}_n \times k(n-4)$$

in which k is a kernel function, x is an input value and $c_i$ is a character value.

With reference to FIG. 6, a tabular representation of a set of generated descriptors operable for various embodiments is presented. Descriptor table 600 represents a set of descriptors, descriptor1 616, descriptor2 618, descriptor3 620, and descriptor4 622, associated with a respective word in a set of words in the column labeled string 614. Contents of descriptor table 600 are generated using the examples of letters of respective words in string 614 in accordance with descriptor system 300 of FIG. 3 and descriptor generation as shown in FIG. 5.

In the current example, they, word 602 is represented in a first row of the table and has assigned value 606 and value 608 for a first descriptor and a second descriptor. Similarly hit, word 604 is represented in a first row of the table and has assigned value 606 and value 608 for a respective first descriptor and a second descriptor. Again in the example of descriptor table 600 a set of words comprising only three letters is clearly represented by a corresponding set of four descriptors.

The result of each mapping goes through a kernel-based transformation. After the transformation, a vector of descriptors is yielded and the statistical model is used for discovering patterns in the vector. The discovered patterns are presented in a report.

The keyboard mapping assigns close numeric values to near keys. This mapping assigns each key to a matrix row and column position. Each (x, y) pair is concatenated for composing a unique numeric vector.

The mapping resultant numeric vector is an input for the kernel-based transformation, which is like a convolution transformation. The kernel-based function is predefined as an analytical function. The results obtained by the pattern analysis are consolidated in a report, which can be dynamic or static.

Referring back to the example of FIG. 4, ASCII encoding is used, but other encodings are also supported and other types of mapping rather than character encoding as well. The analyzed word "they" in one example is decomposed into constituent portions of letters as in 't'—'h'—'e'—'y' represented as $c_1$=ascii('t')=116, $c_2$=ascii('h')=104, $c_3$=ascii('e')=101 and $c_4$=ascii('y')=121 wherein $c_n$ represents a character and position with the word, ascii defines the mapping as in ASCII character encoding. Each value is normalized using a function expressed as:

$$\overline{c}_i = \frac{c_i - 97}{25}$$

With this particular normalization, each data value is constrained to being within a set of values [0,1]. A transformation kernel is selected, for example, a logistic sigmoid function expressed by equation. A sigmoid function is defined as a mathematical function having an "S" shape or sigmoid curve.

$$k(x) = \frac{1}{1 + e^{-x}}, \forall x \in \mathbb{R}.$$

The variable k represents a selected kernel function, x represents an input value as a real number and e represents a constant as in Euler's formula.

Using the example of descriptor table 600, a quantity of descriptors is set to 4, thus each descriptor is given by an inner product of the array of the normalized ASCII values and a position corresponding value of the transformation kernel function, as in a discrete convolution of the kernel function over the normalized array. However as previously stated when using an embodiment of the disclosure, the quantity of descriptors may be defined as an arbitrary number. The number of word descriptors is defined empirically. The larger the number of word descriptors, the more precise the result.

Once extracted the descriptors for all strings in the source set, a selected predefined pattern recognition algorithm, for example, supervised classifiers, regression or clustering may be used. Because typical pattern recognition algorithms work only with numeric data, the typical pattern recognition algorithms cannot be used for text mining. However the kernel-based strings descriptors of an embodiment can be used for this purpose.

Figure 7:
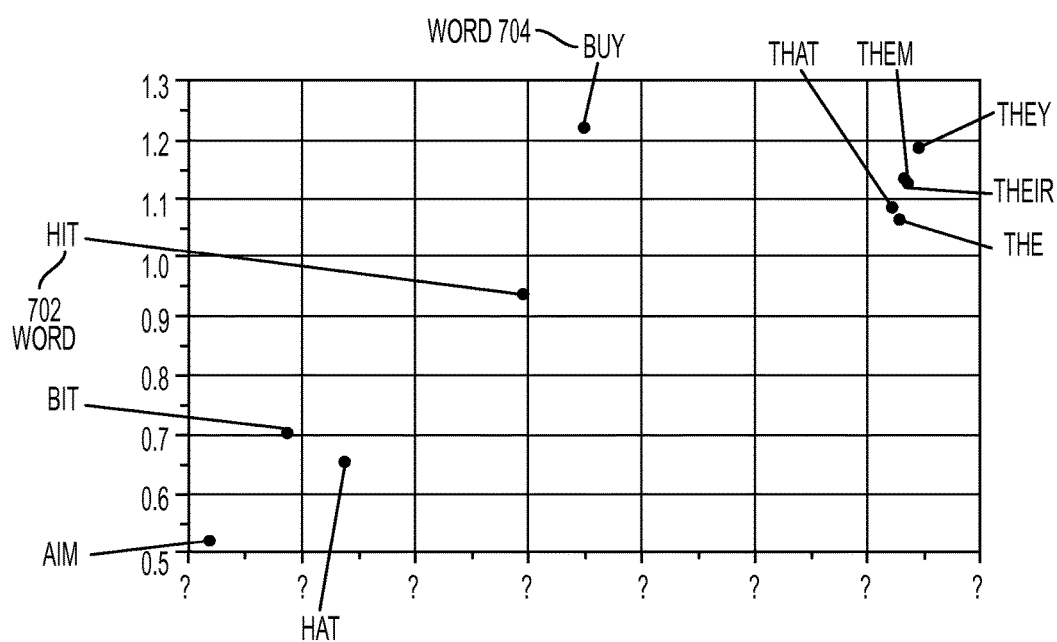

With reference to FIG. 7, a chart representation of a set of generated descriptors operable for various embodiments is presented. Scatter plot 700 is an example of using the first two descriptors of each string, Descriptor1 616 having values 606 and 608 and Descriptor2 618 having values 610 and 612 for respective words of String 614 of FIG. 6 and plotting the values of the two vectors. Word 702 corresponds to 'they,' word 602 of FIG. 6 while bit, word 704 corresponds to word 604 of FIG. 6. Other words from table 600 of FIG. 6 are plotted in a similar manner. The spatial arrangement depicted forms a visualization of content similarity for the set of words of the example.

Figure 8:
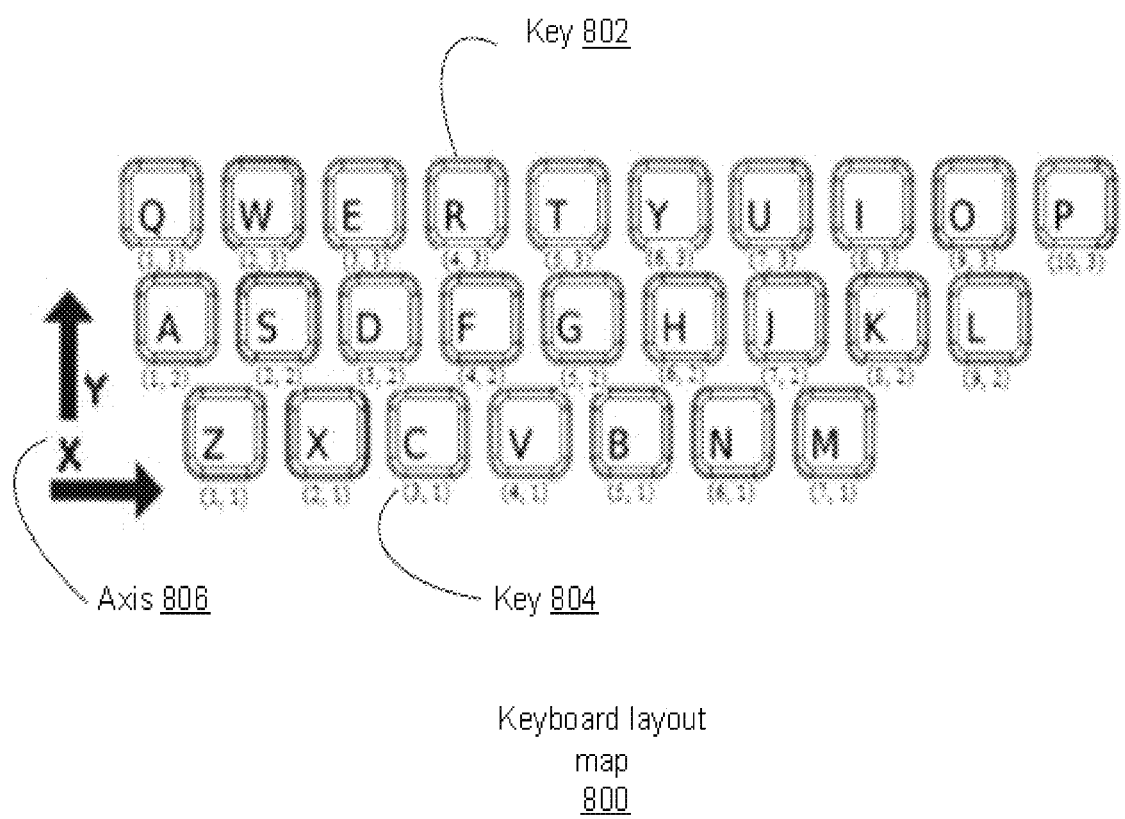

With reference to FIG. 8, a graphic representation of a keyboard layout map operable for various embodiments is presented. Keyboard layout map 800 is representative of a typical national keyboard as used in North American data processing. The layout is referred to as QWERTY due to the sequence of characters represented in a portion of the top row.

The ASCII mapping previously presented is just one example of a mapping. Keyboard layout map 800 is only one of other forms of mapping, which in a particular scenario is typically more useful, for example, using keyboard mapping for typing error corrections. Additional mappings mentioned previously include OCR and speech to text.

Using the keyboard layout map 800 as an example words in the text stream provided as isolated for processing as units. Each letter of each word is mapped to a numeric value, or as in this case an particular x, y pair, for example, a key 802 having an associated pairing of (4,3) and a key 804 having an associated pairing of (3,1) on an x, y axis 806 depending on the chosen mapping. Some examples of possible mappings of common keyboard layouts typically include DVORAK, QWERTY, and AZERTY.

The mappings are used to identify similarities between letters. For example, in the QWERTY keyboard layout the characters Q and W have similar values because letter keys are close to each other on the particular keyboard. In a similar manner when performing OCR mapping an upper case I has a similar value to a lowercase L since they have similar shapes. In a speech-to-text mapping letters S and Z have similar values because of similar sounds. OCR, keyboard and speech-to-text are only examples while the number of possible mappings can readily be appreciated to be large and varied.

The mapped values are preprocessed. In practice the values are typically normalized to an interval [0,1]. Using the QWERTY example, 'Q' is mapped to value 0, 'W' is mapped to value 0.02, 'E' is mapped to value 0.04, . . . 'N' is mapped to value 0.90 and 'M' is mapped to value 0.92. A difference between the mapped values of Q and W is the same difference as between N and M, since the respective letters are next to each other in the keyboard two by two; however, Q and M have very different mappings because the letters are far away from each other.

With reference to an example using OCR, a lowercase 'l' shape is mapped to a value 0.10, a lowercase 't' shape is mapped to a value 0.11, an uppercase 'O' shape is mapped to value 0.87, an uppercase 'Q' shape is mapped to a value 0.88. The difference between the mappings of t and l, and as well as the difference between O and Q, is very small because the shapes are very similar.

With reference to an example using speech-to-text, an 'S' sound is mapped to value 0.3, a 'Z' sound is mapped to a value 0.4, a 'K' sound is mapped to a value 0.63 and a 'Q' sound is mapped to a value 0.65. The difference between S and Z is small because the sounds are similar; while the difference between K and Z is large because the sounds are completely different.

Given the normalized values, descriptors are generated using a kernel function, selected from a set of predefined different types of kernel functions including Gaussian, Logistic Sigmoid, and other kernel functions readily available. There can only be one descriptor per letter, but the number of descriptors per word is arbitrary. Once all the letter descriptors have been created, the word descriptors are generated using a convolution between the vector of letter descriptors and the kernel transformation function as in k(x): $d_1$=v_letters×k(x−1), $d_2$=v_letters×k(x−2), . . . , $d_n$=v_letters×k(x−n). The word descriptors are thus defined as [$d_1$, $d_2$, . . . , $d_n$].

Having calculated the vector of descriptors for the particular word, a solution can be achieved using a selected one of predefined machine learning and data mining algorithms. An embodiment is typically used in analysis and correction of typing errors, analysis of similarity between typed words, an improved OCR system and in improved speech-to-text systems.

Figure 9:
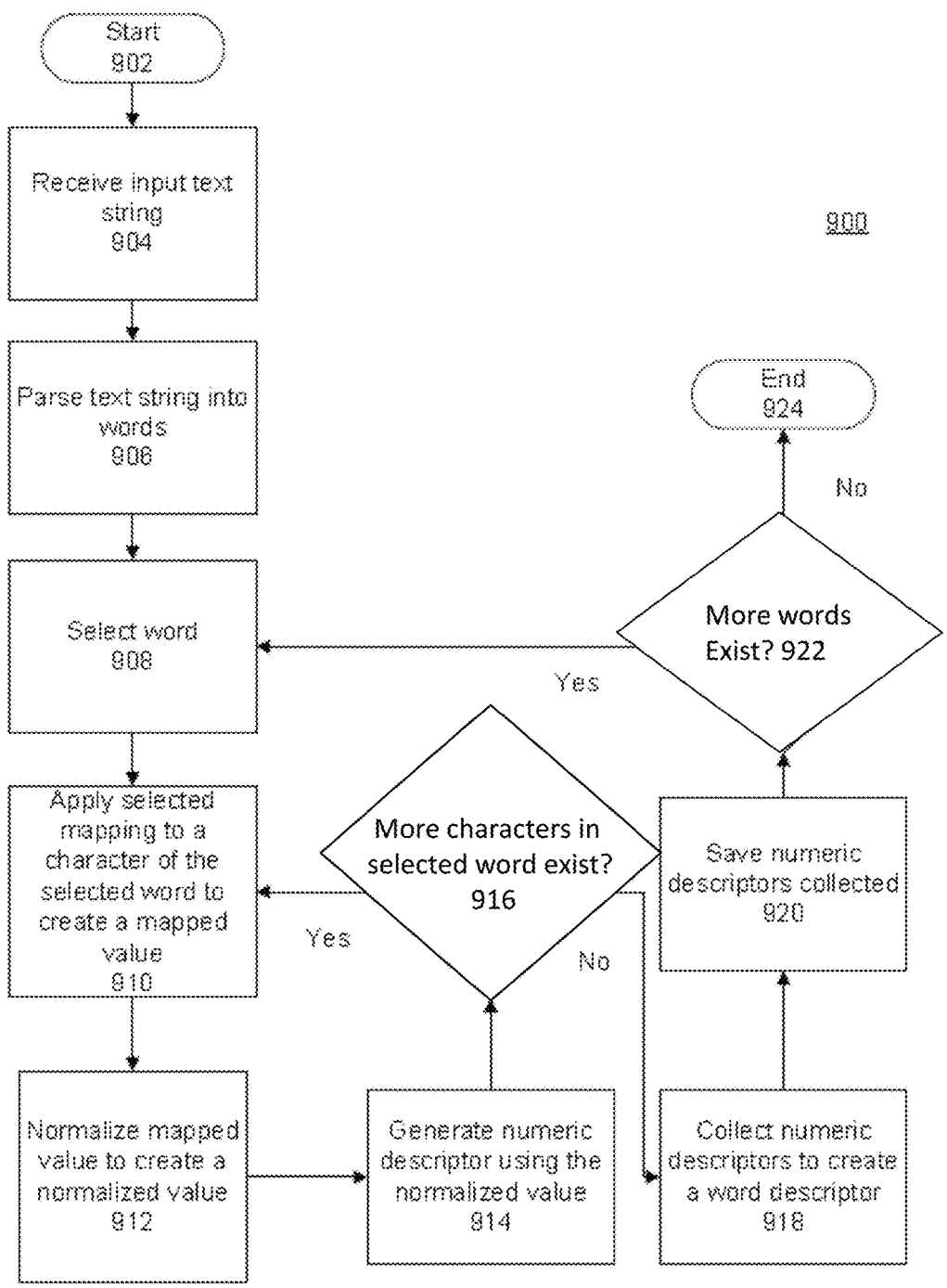

With reference to FIG. 9, a flowchart of a process of generating descriptors operable for various embodiments is presented. Process 900 is an example of a process using the descriptor system 300 of FIG. 3.

Process 900 begins (block 902) and receives input text string (block 904). The input text string typically is obtained from a selected one of input sources including text data, sound data and OCR data input.

Process 900 parses the text string received into words (block 906). Each word is a unit of text to be processed as a unit. A word is selected (block 908). Process 900 applies a selected mapping to a character of the selected word to create a mapped value (block 910). The selected mapping is chosen from a set of predefined mappings applicable to a specific environment, task or purpose. Predefined mappings include keyboard mappings, character encoding mappings or other user defined mappings between a letter or character and an associated numeric value or as in the case of the previously discussed keyboard mappings an x, y paring.

Process 900 normalizes the mapped value to create a normalized value (block 912). The normalization is not limited to the example presented previously but is used to provide a pre-processed value to a selected predefined kernel function.

Process 900 generates a numeric descriptor using the normalized value (block 914). The generation is performed in a component referred to as a descriptor generator, which is a selected one of a set of predefined kernel functions. The set of predefined kernel functions provides flexibility in choosing a kernel function, as any typical kernel function will provide a suitable result for further use.

Process 900 determines whether more characters in the selected word exist (block 916). In response to a "yes" determination, process 900 loops back to perform block 910 as before. In response to a "no" determination, process 900 collects the numeric descriptors to create a word descriptor (block 918). A convolution between the vector of letter descriptors and the kernel transformation function yields a word descriptor in the form of [$d_1$, $d_2$, . . . , $d_n$], wherein $d_1$ represents a first descriptor of the particular word and $d_n$ represents a last descriptor of the particular word in accordance with a predefined number of descriptors.

Process 900 saves numeric descriptors collected (block 920). The saved numeric descriptors are typically saved in a PMML file for subsequent use. The saved descriptors are further used in training for machined learning and analysis as well as a comparison operation, for example, when searching for patterns or string content similarity occurrences.

Process 900 determines whether more words exist (block 922). In response to a "yes" determination, process 900 loops back to perform block 908 as before. In response to a "no" determination, process 900 terminates (block 924).

Thus is presented in an illustrative embodiment a computer-implemented process for generating a descriptor representative of a text unit receives as input a text string into a memory accessible to a processor and parses the text string into words. A word is selected from the words to form a selected word and applies a selected mapping to a character of the selected word to create a mapped value. The mapped value is normalized to create a normalized value and a numeric descriptor, is generated using the normalized value. The numeric descriptors are collected for the selected word to create a word descriptor and saved by the processor into a storage device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for generating a descriptor representative of a text unit, comprising:
    receiving as input a text string into a memory accessible to a processor;
    parsing, by the processor, the text string into words;
    selecting, by the processor, a word from the words to form a selected word;
    applying a selected mapping, by the processor to a character of the selected word, to create a mapped value;
    normalizing the mapped value, by the processor, to create a normalized value;
    generating a numeric descriptor, by the processor, using the normalized value;
    collecting the numeric descriptors, by the processor, for the selected word to create a word descriptor;
    saving, by the processor, the descriptors collected by the processor in a storage device; and
    comparing one or more kernel based string descriptors of a first selected word to one or more kernel based string descriptors of a second selected word of a text stream using a selected one of a predefined set of statistical models to identify a pattern.

2. The method of claim 1, wherein applying a selected mapping to a character of the selected word to create a mapped value further comprises:
    selecting, by the processor, a mapping from a set of predefined mappings stored in the storage device, comprising a selected one of one or more keyboard mappings, one or more character encoding mappings, one or more optical character recognition mappings, and one or more sound mappings.

3. The method of claim 1, wherein normalizing the mapped value to create a normalized value further comprises:
    selecting, by the processor, one of a set of predefined normalization functions stored in the storage device, comprising a function expressed as $$\bar{c}_i = \frac{c_i - 97}{25}$$

wherein $c_i$ represents a character derived from the selected word.

4. The method of claim 1, wherein generating a numeric descriptor using the normalized value further comprises:
    transforming each of the normalized values, by the processor, to a kernel based string descriptor, wherein each kernel based string descriptor is given by an inner product of an array of the normalized values and a position corresponding to a value of a transformation kernel function including a transformation kernel based function expressed as $$k(x) = \frac{1}{1+e^{-x}}, \forall x \in \mathbb{R}.$$

5. The method of claim 1, wherein to form a set of kernel based string descriptors for each word further comprises:

a convolution between a vector of letter descriptors and a kernel transformation function to yield a word descriptor in a form of $[d_1, d_2, \ldots, d_n]$, wherein $d_1$ represents a first descriptor of the selected word and $d_n$ represents a last descriptor of the selected word in accordance with a predefined number of descriptors.

6. The method of claim 1, wherein receiving as input a text string into a memory accessible to a processor further comprises:
    receiving a set of codes, by the processor, wherein the set of codes comprise one or more characters representing one or more words.

7. A computer program product for generating a descriptor representative of a text unit, comprising:
    a computer readable storage medium containing computer executable program code stored thereon, the computer executable program code which when executed by a computer directs the computer to:
    receive as input a text string into a memory accessible to the computer;
    parse the text string into words;
    select a word from the words to form a selected word;
    apply a selected mapping to a character of the selected word to create a mapped value;
    normalize the mapped value to create a normalized value;
    generate a numeric descriptor using the normalized value;
    collect the numeric descriptors for the selected word to create a word descriptor;
    save the descriptors collected by the processor in a storage device; and
    compare one or more kernel based string descriptors of a first selected word to one or more kernel based string descriptors of a second selected word of a text stream using a selected one of a predefined set of statistical models to identify a pattern.

8. The computer program product of claim 7, wherein the computer executable program code which when executed by the computer directs the computer to apply a selected mapping to a character of the selected word to create a mapped value further directs the computer to:
    select the mapping from a set of predefined mappings stored in the storage device, comprising a selected one of: one or more keyboard mappings, one or more character encoding mappings, one or more optical character recognition mappings, and one or more sound mappings.

9. The computer program product of claim 7, wherein the computer executable program code which when executed by the computer directs the computer to normalize the mapped value to create a normalized value further directs the computer to:
    select one of a set of predefined normalization functions stored in the storage device, including a function expressed as $$\bar{c}_i = \frac{c_i - 97}{25}$$

wherein $c_i$ represents a character derived from the selected word.

10. The computer program product of claim 7, wherein the computer executable program code which when executed by the computer directs the computer to generate a numeric descriptor using the normalized value further directs the computer to:

transform each of the normalized values, by the processor, to a kernel based string descriptor, wherein each kernel based string descriptor is given by an inner product of an array of the normalized values and a position corresponding to a value of a transformation kernel function including a transformation kernel based function expressed as $$k(x) = \frac{1}{1+e^{-x}}, \forall x \in \mathbb{R}.$$

11. The computer program product of claim 7, wherein the computer executable program code which when executed by the computer directs the computer to form a set of kernel based string descriptors for each word further directs the computer to:
form a convolution between a vector of letter descriptors and a kernel transformation function to yield a word descriptor in a form of $[d_1, d_2, \ldots, d_n]$, wherein $d_1$ represents a first descriptor of the selected word and $d_n$ represents a last descriptor of the selected word in accordance with a predefined number of descriptors.

12. The computer program product of claim 7, wherein the computer executable program code which when executed by the computer directs the computer to receive as input a text string into a memory accessible to a processor further directs the computer to:
receive a set of codes, wherein the set of codes comprise one or more characters representing one or more words.

13. An apparatus for generating a descriptor representative of a text unit, comprising:
a communications fabric;
a memory connected to the communications fabric, wherein the memory contains computer executable program code;
a communications unit connected to the communications fabric;
an input/output unit connected to the communications fabric;
a display connected to the communications fabric; and
a processor unit connected to the communications fabric, wherein the processor unit executes the computer executable program code to direct the apparatus to:
receive as input a text string into a memory accessible to the computer;
parse the text string into words;
select a word from the words to form a selected word;
apply a selected mapping to a character of the selected word to create a mapped value;
normalize the mapped value to create a normalized value;
generate a numeric descriptor using the normalized value;
collect the numeric descriptors for the selected word to create a word descriptor;
save the descriptors collected by the processor in a storage device; and compare one or more kernel based string descriptors of a first selected word to one or more kernel based string descriptors of a second selected word of a text stream using a selected one of a predefined set of statistical models to identify a pattern.

14. The apparatus of claim 13, wherein the processor unit executes the computer executable program code to apply a selected mapping to a character of the selected word to create a mapped value further directs the apparatus to:
select a mapping from a set of predefined mappings stored in the storage device, comprising a selected one of one or more keyboard mappings, one or more character encoding mappings, one or more optical character recognition mappings, and one or more sound mappings.

15. The apparatus of claim 13, wherein the processor unit executes the computer executable program code to normalize the mapped value to create a normalized value further directs the apparatus to:
select one of a set of predefined normalization functions stored in the storage device, comprising a function expressed as $$\overline{c}_i = \frac{c_i - 97}{25}$$

wherein $c_i$ represents a character derived from the selected word.

16. The apparatus of claim 13, wherein the processor unit executes the computer executable program code to generate a numeric descriptor using the normalized value further directs the apparatus to:
transform each of the normalized values to a kernel based string descriptor, wherein each kernel based string descriptor is given by an inner product of an array of the normalized values and a position corresponding to a value of a transformation kernel function including a transformation kernel based function expressed as $$k(x) = \frac{1}{1+e^{-x}}, \forall x \in \mathbb{R}.$$

17. The apparatus of claim 13, wherein the processor unit executes the computer executable program code to form a set of kernel based string descriptors for each word further directs the apparatus to:
form a convolution between a vector of letter descriptors and a kernel transformation function to yield a word descriptor in a form of $[d_1, d_2, \ldots, d_n]$, wherein $d_1$ represents a first descriptor of the selected word and $d_n$ represents a last descriptor of the selected word in accordance with a predefined number of descriptors.

* * * * *